(12) United States Patent
Yoon et al.

(10) Patent No.: US 6,809,026 B2
(45) Date of Patent: Oct. 26, 2004

(54) SELECTIVE DEPOSITION OF A BARRIER LAYER ON A METAL FILM

(75) Inventors: Hyungsuk Alexander Yoon, Santa Clara, CA (US); Michael X. Yang, Palo Alto, CA (US); Hui Zhang, Santa Clara, CA (US); Soonil Hong, Mountain View, CA (US); Ming Xi, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/322,345

(22) Filed: Dec. 18, 2002

(65) Prior Publication Data

US 2003/0181035 A1 Sep. 25, 2003

Related U.S. Application Data

(60) Provisional application No. 60/342,225, filed on Dec. 21, 2001.

(51) Int. Cl.[7] .......................................... H01L 21/4763
(52) U.S. Cl. ...................................... 438/627; 438/622
(58) Field of Search .............................. 438/618, 620, 438/622–629, 632, 633, 643, 655

(56) References Cited

U.S. PATENT DOCUMENTS

| | | | |
|---|---|---|---|
| 5,306,666 A | 4/1994 | Izumi | 437/192 |
| 5,916,365 A | 6/1999 | Sherman | 117/92 |
| 6,042,652 A | 3/2000 | Hyun et al. | 118/719 |
| 6,139,700 A | 10/2000 | Kang et al. | 204/192.17 |
| 6,200,893 B1 | 3/2001 | Sneh | 438/685 |
| 6,203,613 B1 | 3/2001 | Gates et al. | 117/104 |

(List continued on next page.)

FOREIGN PATENT DOCUMENTS

| | | | |
|---|---|---|---|
| EP | 1 167 569 | 1/2002 | C23C/16/455 |
| JP | 2000178735 | 6/2000 | C23C/16/08 |
| JP | 2001111000 | 4/2001 | H01L/27/105 |
| WO | WO 98/51838 | 11/1998 | C23C/16/06 |
| WO | WO 00/54320 | 9/2000 | H01L/21/44 |
| WO | WO 01/15220 | 3/2001 | H01L/21/768 |
| WO | WO 01/27346 | 4/2001 | C23C/16/44 |
| WO | WO 01/27347 | 4/2001 | C23C/16/44 |
| WO | WO 01/29280 | 4/2001 | C23C/16/32 |
| WO | WO 01/29891 | 4/2001 | H01L/21/768 |
| WO | WO 01/29893 | 4/2001 | H01L/21/768 |
| WO | WO 01/66832 | 9/2001 | C30B/25/14 |
| WO | WO 02/45167 | 6/2002 | H01L/27/00 |
| WO | WO 02/067319 | 8/2002 | H01L/21/768 |

OTHER PUBLICATIONS

Yang, et al. "Atomic Layer Deposition of Tungsten Film from WF6/B2H6: Nucleation Layer for Advanced Semiconductor Device," Conference Proceedings ULSI XVII (2002) Materials Research Society.

Klaus, et al. "Atomic Layer Deposition of $SiO_2$ Using Catalyzed and Uncatalyzed Self–Limiting Surface Reactions," Surface Review and Letters, vol. 6, Nos. 3 & 4 (1999) 435–448.

*Primary Examiner*—David A. Zarneke
*Assistant Examiner*—Asok Kumar Sarkar
(74) *Attorney, Agent, or Firm*—Moser Patterson Sheridan

(57) ABSTRACT

A method to selectively deposit a barrier layer on a metal film formed on a substrate is disclosed. The barrier layer is selectively deposited on the metal film using a cyclical deposition process including a predetermined number of deposition cycles followed by a purge step. Each deposition cycle comprises alternately adsorbing a refractory metal-containing precursor and a reducing gas on the metal film formed on the substrate in a process chamber.

43 Claims, 9 Drawing Sheets

U.S. PATENT DOCUMENTS

| | | |
|---|---|---|
| 6,207,487 B1 | 3/2001 | Kim et al. .................. 438/238 |
| 6,270,572 B1 | 8/2001 | Kim et al. .................... 117/93 |
| 6,284,646 B1 | 9/2001 | Leem ........................ 438/629 |
| 6,287,965 B1 | 9/2001 | Kang et al. ................. 438/648 |
| 6,305,314 B1 | 10/2001 | Sneh et al. ................. 118/723 |
| 6,333,260 B1 | 12/2001 | Kwon et al. ................ 438/643 |
| 6,342,277 B1 | 1/2002 | Sherman .................... 427/562 |
| 6,355,561 B1 | 3/2002 | Sandhu et al. .............. 438/676 |
| 6,358,829 B2 | 3/2002 | Yoon et al. ................. 438/597 |
| 6,368,954 B1 | 4/2002 | Lopatin et al. ............. 438/627 |
| 6,369,430 B1 | 4/2002 | Adetutu et al. ............ 257/382 |
| 6,372,598 B2 | 4/2002 | Kang et al. ................. 438/399 |
| 6,391,785 B1 | 5/2002 | Satta et al. ................. 437/704 |
| 6,399,491 B2 | 6/2002 | Jeon et al. .................. 438/680 |
| 6,416,822 B1 | 7/2002 | Chiang et al. .............. 427/561 |
| 6,420,189 B1 | 7/2002 | Lopatin ........................ 438/2 |
| 6,423,619 B1 | 7/2002 | Grant et al. ................ 438/589 |
| 6,428,859 B1 | 8/2002 | Chiang et al. .............. 427/457 |
| 6,447,933 B1 | 9/2002 | Wang et al. ................ 428/635 |
| 6,451,695 B2 | 9/2002 | Sneh .......................... 438/685 |
| 6,461,914 B1 * | 10/2002 | Roberts et al. ............. 438/253 |
| 6,468,924 B2 | 10/2002 | Lee et al. .................... 438/763 |
| 6,475,276 B1 | 11/2002 | Elers et al. .................... 117/84 |
| 6,475,910 B1 | 11/2002 | Sneh .......................... 438/685 |
| 6,482,262 B1 | 11/2002 | Elers et al. .................... 117/84 |
| 6,482,733 B2 | 11/2002 | Raaijmakers ............... 438/633 |
| 6,482,740 B2 | 11/2002 | Soininen et al. ............ 438/686 |
| 6,534,395 B2 | 3/2003 | Werkhoven et al. ........ 438/627 |
| 6,635,965 B1 * | 10/2003 | Lee et al. .................... 257/758 |
| 2001/0000866 A1 | 5/2001 | Sneh et al. .................. 118/715 |
| 2001/0002280 A1 | 5/2001 | Sneh ...................... 427/255.28 |
| 2001/0009140 A1 | 7/2001 | Bondestan et al. ......... 118/725 |
| 2001/0009695 A1 | 7/2001 | Saanila et al. .......... 427/255.39 |
| 2001/0024387 A1 | 9/2001 | Raaijmakers et al. ....... 365/200 |
| 2001/0028924 A1 | 10/2001 | Sherman ................ 427/255.28 |
| 2001/0029094 A1 | 10/2001 | Mee-Young et al. ........ 438/597 |
| 2001/0034123 A1 | 10/2001 | Jeon et al. .................. 438/643 |
| 2001/0041250 A1 | 11/2001 | Werkhoven et al. ........ 428/212 |
| 2001/0054730 A1 | 12/2001 | Kim et al. ................... 257/301 |
| 2001/0054769 A1 | 12/2001 | Raaijmakers et al. ....... 257/758 |
| 2002/0000598 A1 | 1/2002 | Kang et al. .................. 257/301 |
| 2002/0004293 A1 | 1/2002 | Soininen et al. ............ 438/584 |
| 2002/0007790 A1 | 1/2002 | Park ............................ 118/715 |
| 2002/0019121 A1 | 2/2002 | Pyo ............................ 438/618 |
| 2002/0031618 A1 | 3/2002 | Sherman .................... 427/569 |
| 2002/0037630 A1 | 3/2002 | Agarwal et al. ............ 438/430 |
| 2002/0048880 A1 | 4/2002 | Lee ............................ 438/253 |
| 2002/0052097 A1 | 5/2002 | Park ........................... 438/507 |
| 2002/0055235 A1 | 5/2002 | Agarwal et al. ............ 438/430 |
| 2002/0061612 A1 | 5/2002 | Sandhu et al. .............. 438/151 |
| 2002/0068458 A1 | 6/2002 | Chiang et al. .............. 438/694 |
| 2002/0073924 A1 | 6/2002 | Chiang et al. .......... 118/723 R |
| 2002/0076481 A1 | 6/2002 | Chiang et al. .................. 427/8 |
| 2002/0076507 A1 | 6/2002 | Chiang et al. .............. 427/569 |
| 2002/0076508 A1 | 6/2002 | Chiang et al. .............. 427/569 |
| 2002/0076837 A1 | 6/2002 | Hujanen et al. ................ 438/3 |
| 2002/0090829 A1 | 7/2002 | Sandhu et al. .............. 438/761 |
| 2002/0094689 A1 | 7/2002 | Park ............................ 438/694 |
| 2002/0104481 A1 | 8/2002 | Chiang et al. .............. 118/723 |
| 2002/0105088 A1 | 8/2002 | Yang et al. .................. 257/774 |
| 2002/0109168 A1 | 8/2002 | Kim et al. ................... 257/295 |
| 2002/0117399 A1 | 8/2002 | Chen et al. .................. 205/125 |
| 2002/0121697 A1 | 9/2002 | Marsh ......................... 257/751 |
| 2002/0144655 A1 | 10/2002 | Chiang et al. .............. 118/715 |
| 2002/0144657 A1 | 10/2002 | Chiang et al. ........... 118/723 E |
| 2002/0146511 A1 | 10/2002 | Chiang et al. ........... 427/248.1 |
| 2002/0155722 A1 | 10/2002 | Satta et al. .................. 438/704 |
| 2002/0162506 A1 | 11/2002 | Sneh et al. .................. 118/715 |
| 2002/0164421 A1 | 11/2002 | Chiang et al. ........... 427/248.1 |
| 2002/0164423 A1 | 11/2002 | Chiang et al. ......... 427/255.28 |
| 2002/0182320 A1 | 12/2002 | Leskela et al. .............. 427/250 |
| 2002/0187256 A1 | 12/2002 | Elers et al. .................... 427/99 |
| 2002/0187631 A1 | 12/2002 | Kim et al. ................... 438/637 |
| 2002/0197402 A1 | 12/2002 | Chiang et al. ......... 427/255.39 |
| 2003/0013320 A1 | 1/2003 | Kim et al. ................... 438/778 |
| 2003/0031807 A1 | 2/2003 | Elers et al. .................. 427/569 |
| 2003/0032281 A1 | 2/2003 | Werkhoven et al. ........ 438/640 |
| 2003/0049942 A1 | 3/2003 | Haukka et al. .............. 438/778 |
| 2003/0072975 A1 | 4/2003 | Shero et al. ................. 428/704 |
| 2003/0082296 A1 | 5/2003 | Elers et al. .................... 427/96 |

* cited by examiner

SELECTIVE DEPOSITION OF A BARRIER LAYER ON A METAL FILM

CROSS-REFERENCE TO RELATED APPLICATIONS

This application claims benefit of U.S. provisional patent application Ser. No. 60/342,225, filed on Dec. 21, 2001, which is incorporated by reference in its entirety.

BACKGROUND OF THE INVENTION

1. Field of the Invention

Embodiments of the present invention relate generally to a method of tungsten layer formation.

2. Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance thereof. For example, low resistivity metal interconnects (e.g., aluminum (Al) and copper (Cu)) provide conductive paths between the components on integrated circuits.

Referring to FIG. 1, the metal interconnects 2 are typically electrically isolated from each other by a bulk insulating material 4. When the distance between adjacent metal interconnects 2 and/or the thickness of the bulk insulating material 4 has sub-micron dimensions, capacitive coupling potentially occurs between such interconnects 2. Capacitive coupling between adjacent metal interconnects 2 may cause cross-talk and/or resistance-capacitance (RC) delay, which degrades the overall performance of the integrated circuit.

In order to minimize capacitive coupling between adjacent metal interconnects, low dielectric constant bulk insulating materials 4 (e.g., dielectric constants less than about 3.5) are used. Examples of low dielectric constant bulk insulating materials include silicon dioxide ($SiO_2$), silicate glass and organosilicates, among others.

In addition, a barrier layer 6 is typically formed over the metal interconnects 2 as well as the bulk insulating material 4. The barrier layer 6 minimizes the diffusion of the metal from the metal interconnects 2 into a subsequently deposited insulating material layer 8. Diffusion of the metal from the metal interconnects 2 into the subsequently deposited insulating material layer 8 is undesirable because such diffusion can affect the electrical performance of the integrated circuit (e.g., cross-talk and or RC delay) or render it inoperable.

Silicon carbide is often used for the barrier layer 6. However, silicon carbide has a dielectric constant of about 4.0 to about 5.0. The dielectric constant of the silicon carbide in conjunction with the dielectric constant of the bulk insulating materials tends to increase the overall dielectric constant of the metal interconnect structure which may degrade the performance of the integrated circuit.

Thus, a need exists for a method to selectively deposit a barrier layer on a metal film.

SUMMARY OF THE INVENTION

A method to selectively deposit a barrier layer on a metal film formed on a substrate is described. The barrier layer may comprise a refractory metal such as, for example, tungsten (W). The barrier layer is selectively deposited on the metal film using a cyclical deposition process including a predetermined number of deposition cycles followed by a purge step.

In the cyclical deposition process, each deposition cycle comprises alternately adsorbing a refractory metal-containing precursor and a reducing gas on the metal film formed on the substrate in a process chamber. The refractory metal-containing precursor and the reducing gas react to form the barrier layer on the metal film. After a predetermined number of deposition cycles are completed, the process chamber is purged of both the refractory metal-containing precursor and the reducing gas. This deposition sequence of performing a predetermined number of deposition cycles followed by a process chamber purge may be repeated until a desired barrier layer thickness is achieved.

The predetermined number of deposition cycles is selected to take advantage of differences in the number of deposition cycles needed to start depositing the barrier material on different types of material layers. Thus, the predetermined number of deposition cycles is advantageously selected to start deposition of the barrier material on the metal film but be less than the number of deposition cycles needed to start deposition of such barrier material on layers surrounding the metal film. As such, barrier material is only deposited on the metal film without being deposited on any surrounding material layers.

The selective deposition of the barrier layer is compatible with integrated circuit fabrication processes. In one integrated circuit fabrication process, the barrier layer is used as a cap layer for a metal feature in a damascene structure. For such an embodiment, a preferred process sequence includes providing a substrate having metal features formed thereon that are surrounded by a dielectric oxide. A barrier layer is selectively deposited on the metal features using a cyclical deposition process in which a predetermined number of deposition cycles, each comprising alternately adsorbing a refractory metal-containing precursor and a reducing gas on the metal features, is followed by a process chamber purge step. The cyclical deposition process is repeated until a desired thickness for the barrier layer is achieved. After the barrier layer is selectively deposited on the metal features, one or more insulating layers are formed thereon and patterned to define vias therethrough to the barrier layer formed on the metal features. Thereafter, the damascene structure is completed by filling the vias with a conductive material.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
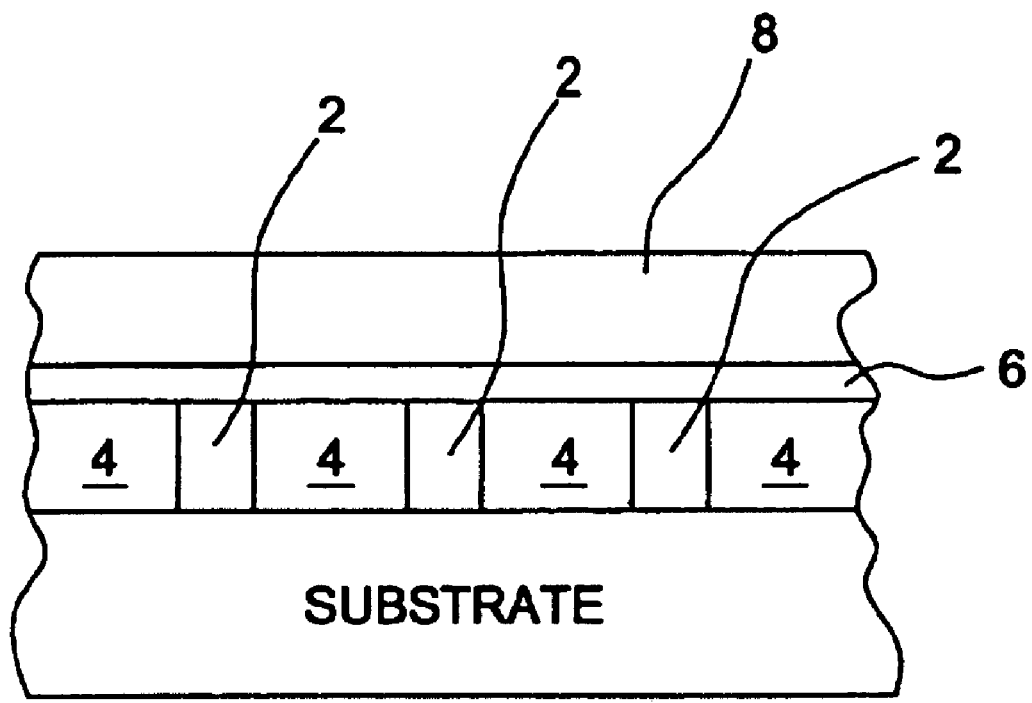
FIG. 1 is a cross-sectional view of a metal interconnect structure including a barrier layer formed over both metal interconnects and bulk insulating material.
Figure 2:
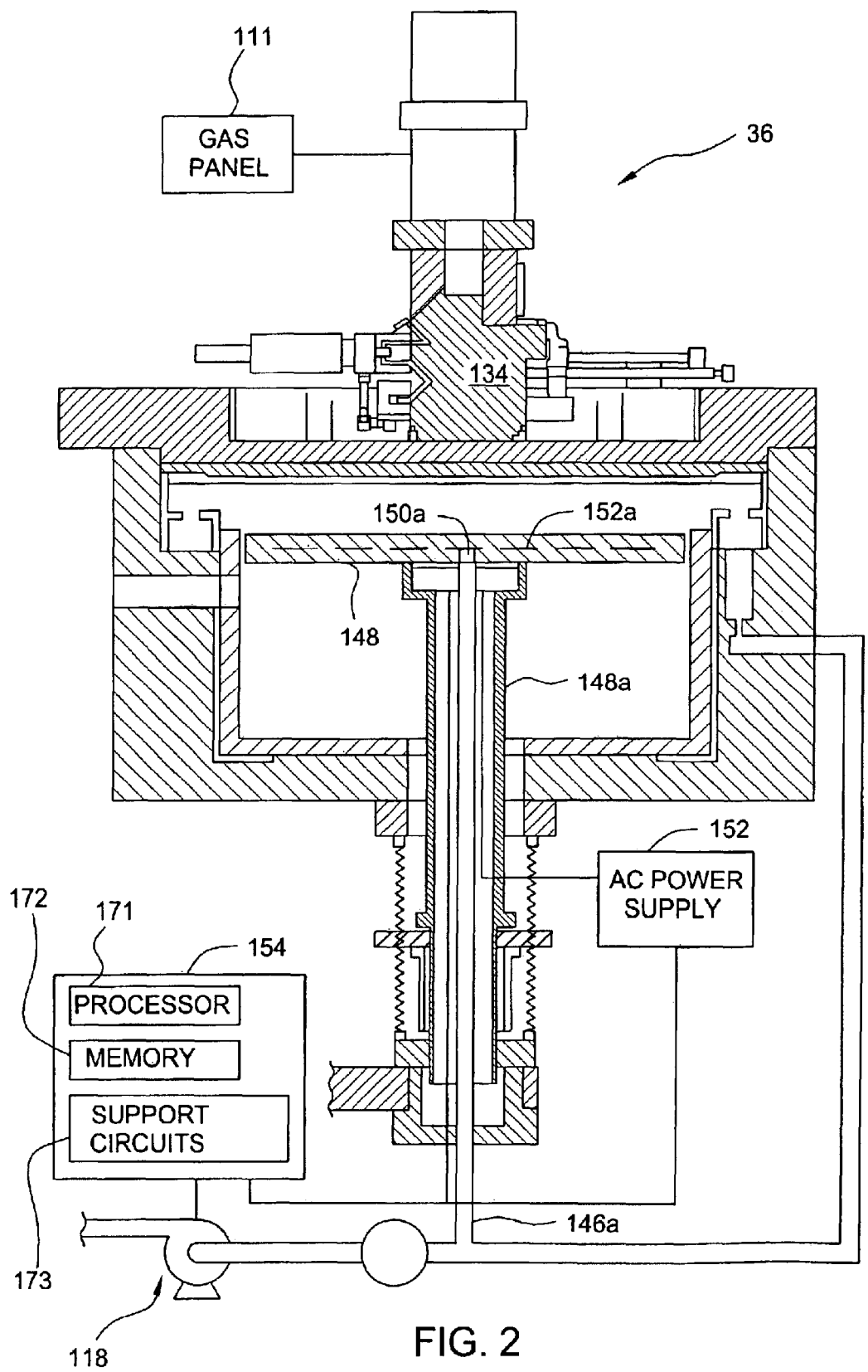
FIG. 2 depicts a schematic cross-sectional view of a process chamber that can be used to perform a cyclical deposition process as described herein.

FIG. 2 depicts a schematic cross-sectional view of a process chamber 36 that can be used to perform a cyclical deposition process in accordance with embodiments described herein. The process chamber 36 generally houses a wafer support pedestal 148, which is used to support a substrate (not shown). The wafer support pedestal 148 is movable in a vertical direction inside the process chamber 36 using a displacement mechanism 148a.

Depending on the specific process, the substrate can be heated to some desired temperature prior to or during deposition. For example, the wafer support pedestal 148 may be heated using an embedded heater element 152a. The wafer support pedestal 148 may be resistively heated by applying an electric current from an AC power supply 152 to the heater element 152a. The substrate (not shown) is, in turn, heated by the pedestal 148. Alternatively, the wafer support pedestal 148 may be heated using radiant heaters, such as, for example, lamps (not shown).

A temperature sensor 150a, such as a thermocouple, is also embedded in the wafer support pedestal 148 to monitor the temperature of the pedestal 148 in a conventional manner. The measured temperature is used in a feedback loop to control the AC power supply 152 for the heating element 152a, such that the substrate temperature can be maintained or controlled at a desired temperature which is suitable for the particular process application.

A vacuum pump 118 is used to evacuate the process chamber 36 and to maintain the pressure inside the process chamber 36. A gas manifold 134, through which process gases are introduced into the process chamber 36, is located above the wafer support pedestal 148. The gas manifold 134 is connected to a gas panel 111, which controls and supplies various process gases to the process chamber 36.

Proper control and regulation of the gas flows to the gas manifold 134 are performed by mass flow controllers (not shown) and a microprocessor controller 154. The gas manifold 134 allows process gases to be introduced and uniformly distributed in the process chamber 36. Additionally, the gas manifold 134 may optionally be heated to prevent condensation of any reactive gases within the manifold.

The gas manifold 134 includes a plurality of electronic control valves (not shown). The electronic control valves as used herein refer to any control valve capable of providing rapid and precise gas flow to the process chamber 36 with valve open and close cycles of less than about 1–2 seconds, and more preferably less than about 0.1 second.

The microprocessor controller 154 may be one of any form of general purpose computer processor (CPU) 171 that can be used in an industrial setting for controlling various chambers and sub-processors. The computer may use any suitable memory 172, such as random access memory, read only memory, floppy disk drive, hard disk, or any other form of digital storage, local or remote. Various support circuits 173 may be coupled to the CPU for supporting the processor in a conventional manner. Software routines as required may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Selective Barrier Layer Deposition on a Metal Film

A method to selectively deposit a barrier layer on a metal film formed on a substrate is described. The barrier layer may comprise a refractory metal, such as, for example, tungsten (W), among others. The barrier layer is selectively deposited on the metal film using a cyclical deposition process including a predetermined number of deposition cycles followed by a purge step.

In the cyclical deposition process, each deposition cycle comprises alternately adsorbing a refractory metal-containing precursor and a reducing gas on the metal film formed on the substrate in a process chamber. The refractory metal-containing precursor and the reducing gas react to form the barrier layer on the metal film. After a predetermined number of deposition cycles are completed, the process chamber is purged of both the refractory metal-containing precursor and the reducing gas. This deposition sequence of performing a predetermined number of deposition cycles followed by a process chamber purge may be repeated until a desired barrier layer is achieved.

The predetermined number of deposition cycles is selected to take advantage of differences in the number of deposition cycles needed to start depositing the barrier material on different types of material layers. Thus, the predetermined number of deposition cycles is advantageously selected to start deposition of the barrier material on the metal film, but be less than the number of deposition cycles needed to start deposition of such barrier material on layers surrounding the metal film. As such, barrier material is only deposited on the metal film without being deposited on any surrounding material layers.

Figure 3:
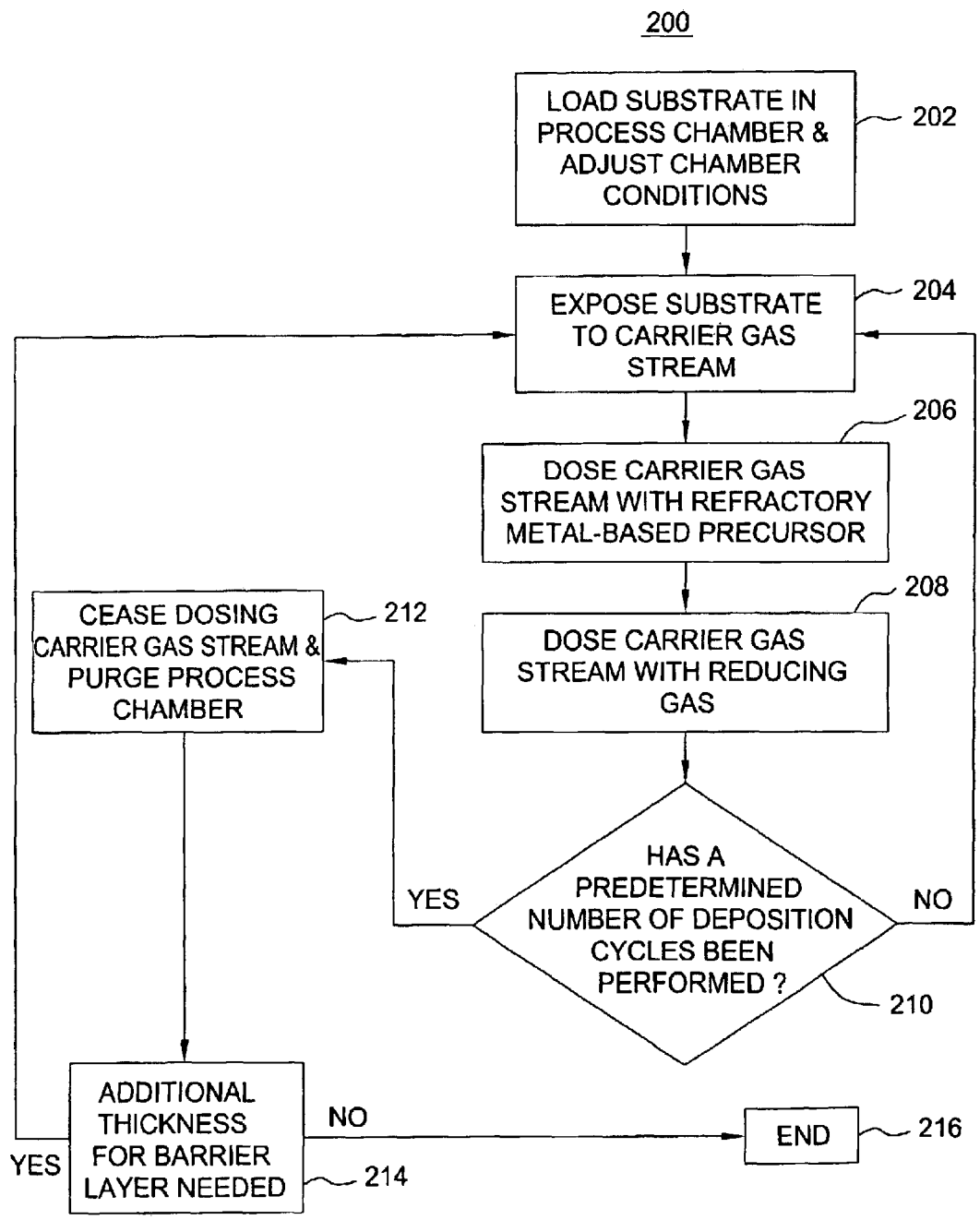
FIG. 3 illustrates a process sequence incorporating selective deposition of a barrier layer on a metal film using a cyclical deposition process according to one embodiment described herein.

FIG. 3 illustrates a process sequence 200 according to the present invention detailing the various steps used for the selective deposition of a barrier layer on a metal film utilizing a constant carrier gas flow. These steps may be performed in a process chamber similar to that described above with reference to FIG. 2. As indicated in step 202, a substrate is introduced into a process chamber. The substrate may be, for example, a silicon substrate having thereon one or more copper features surrounded by insulating material. The process chamber conditions such as, for example, the temperature and pressure are adjusted to enhance the selective deposition of the barrier material on the metal film and impede nucleation of the barrier material on the insulating material.

In one embodiment where a constant carrier gas flow is desired, a carrier gas stream is established within the process chamber, as indicated in step 204. Carrier gases may be selected so as to also act as a purge gas for removal of volatile reactants and/or by-products from the process chamber. Carrier gases such as, for example, helium (He), argon (Ar), nitrogen ($N_2$) and hydrogen ($H_2$), as well as combinations thereof, among others, may be used.

Referring to step 206, after the carrier gas stream is established within the process chamber, a pulse of a refractory metal-containing precursor is added to the carrier gas stream. The term pulse as used herein refers to a dose of material injected into the process chamber or into the carrier gas stream. The pulse may comprise one injection of the refractory metal-containing precursor or several short, sequential injections. The pulse of the refractory metal-containing precursor lasts for a predetermined time interval. When the barrier layer comprises tungsten (W), suitable tungsten-containing precursors may include, for example, tungsten hexafluoride ($WF_6$) and tungsten hexacarbonyl ($W(CO)_6$), among others.

The time interval for the pulse of the refractory metal-containing precursor is variable depending on a number of factors such as, for example, the volume capacity of the process chamber employed, the vacuum system coupled thereto and the volatility/reactivity of the reactants used. In general, the process conditions are advantageously selected so that at least a monolayer of the refractory metal-containing precursor may be adsorbed on the metal film, without adsorption of the refractory metal-containing precursor on surrounding insulating material. Thereafter, excess refractory metal-containing precursor remaining in the process chamber may be removed therefrom by the constant carrier gas stream in combination with the vacuum system.

In step 208, after the excess refractory metal-containing precursor has been sufficiently removed from the process chamber by the carrier gas stream to prevent co-reaction or particle formation with a subsequently provided process gas, a pulse of a reducing gas is added to the carrier gas stream. When the barrier layer comprises tungsten (W) suitable reducing gases may include, for example, silane ($SiH_4$), disilane ($Si_2H_6$), dichlorosilane ($SiCl_2H_2$), borane ($BH_3$), diborane ($B_2H_6$), triborane, tetraborane, pentaborane, hexaborane, heptaborane, octaborane, nanoborane and decaborane, among others.

The pulse of the reducing gas also lasts for a predetermined time interval. In general, the time interval for the pulse of the reducing gas should be long enough to provide a sufficient amount of the reducing gas for reaction with the refractory metal-containing precursor that is already adsorbed on the metal film. Thereafter, excess reducing gas is flushed from the process chamber by the carrier gas stream in combination with the vacuum system.

Steps 204 through 208 comprise one embodiment of a deposition cycle for the barrier layer. For such an embodiment, a constant flow of the carrier gas is provided to the process chamber modulated by alternating periods of pulsing and non-pulsing where the periods of pulsing alternate between the refractory metal-containing precursor and the reducing gas along with the carrier gas stream, while the periods of non-pulsing include only the carrier gas stream.

The time interval for each of the pulses of the refractory metal-containing precursor and the reducing gas may have the same duration. That is, the duration of the pulse of the refractory metal-containing precursor may be identical to the duration of the pulse of the reducing gas. For such an embodiment, a time interval ($T_1$) for the pulse of the refractory metal-containing precursor is equal to a time interval ($T_2$) for the pulse of the reducing gas.

Alternatively, the time interval for each of the pulses of the refractory metal-containing precursor and the reducing gas may have different durations. That is, the duration of the pulse of the refractory metal-containing precursor may be shorter or longer than the duration of the pulse of the reducing gas. For such an embodiment, the time interval ($T_1$) for the pulse of the refractory metal-containing precursor is different than the time interval ($T_2$) for the pulse of the reducing gas.

In addition, the periods of non-pulsing between each of the pulses of the refractory metal-containing precursor and the reducing gas may have the same duration. That is, the duration of the period of non-pulsing between each pulse of the refractory metal-containing precursor and each pulse of the reducing gas may be identical. For such an embodiment, a time interval ($T_3$) of non-pulsing between the pulse of the refractory metal-containing precursor and the pulse of the reducing gas is equal to a time interval ($T_4$) of non-pulsing between the pulse of the reducing gas and the pulse of the refractory metal-containing precursor. During the time periods of non-pulsing only the constant carrier gas stream is provided to the process chamber.

Alternatively, the periods of non-pulsing between each of the pulses of the refractory metal-containing precursor and the reducing gas may have different durations. That is, the duration of the period of non-pulsing between each pulse of the refractory metal-containing precursor and each pulse of the reducing gas may be shorter or longer than the duration of the period of non-pulsing between each pulse of the reducing gas and each pulse of the refractory metal-containing precursor. For such an embodiment, a time interval ($T_3$) of non-pulsing between the pulse of the refractory metal-containing precursor and the pulse of the reducing gas is different from a time interval ($T_4$) of non-pulsing between the pulse of the reducing gas and the pulse of the refractory metal-containing precursor. During the periods of non-pulsing only the constant carrier gas stream is provided to the process chamber.

Additionally, the time intervals for each pulse of the refractory metal-containing precursor, the reducing gas and the periods of non-pulsing therebetween for each deposition cycle may have the same duration. For example, in a first deposition cycle ($C_1$), a time interval ($T_1$) for the pulse of the refractory metal-containing precursor may have the same duration as the time interval ($T_1$) for the pulse of the refractory metal-containing precursor in subsequent deposition cycles ($C_2 \ldots C_N$). Similarly, the duration of each pulse of the reducing gas as well as the periods of non-pulsing between the pulses of the refractory metal-containing precursor and the reducing gas in the first deposition cycle ($C_1$) may have the same duration as each pulse of the reducing gas and the periods of non-pulsing between the pulses of the refractory metal-containing precursor and the reducing gas in subsequent deposition cycles ($C_2 \ldots C_N$), respectively.

Alternatively, the time interval for at least one pulse of the refractory metal-containing precursor, the reducing gas and the periods of non-pulsing therebetween for one or more of the deposition cycles of the barrier layer deposition process may have different durations. For example, in a first deposition cycle ($C_1$), the time interval ($T_1$) for the pulse of the refractory metal-containing precursor may be longer or shorter than the time interval ($T_1$) for the pulse of the refractory metal-containing precursor in subsequent deposition cycles ($C_2 \ldots C_N$). Similarly, the duration of one or more pulse of the reducing gas or the periods of non-pulsing between the pulses of the refractory metal-containing precursor and the reducing gas in deposition cycle ($C_1$) may be longer or shorter than the duration of corresponding pulses of the reducing gas or the periods of non-pulsing between the pulses of the refractory metal-containing precursor and the reducing gas in subsequent deposition cycles ($C_2 \ldots C_N$), respectively.

Referring to step 210, after each deposition cycle (steps 204 through 208), the total number of deposition cycles performed is determined. If a predetermined number of deposition cycles have not been performed, steps 204 through 208 are repeated until such predetermined number of deposition cycles, have been completed. However, if a predetermined number of deposition cycles have been completed, the process chamber is purged of both the refractory metal-containing precursor and the reducing gas, as indicated by step 212. The process chamber may be purged using the carrier gas stream. After the process chamber is purged, additional predetermined numbers of deposition cycles (steps 204 through 208) may be performed until a desired thickness for the barrier layer is achieved as indicated by step 214, or ended as indicated by step 216.

For a particular barrier material, the predetermined number of deposition cycles is selected to start depositing barrier material on the metal film within the first few deposition cycles, but be less than the number of deposition cycles needed to start depositing such barrier material on the surrounding insulating material layer. Limiting the number of deposition cycles to a predetermined number that is less than the number needed to start deposition of barrier material on the surrounding insulating material and than purging the process chamber, permits selective deposition of the barrier material only on the metal film.

Figure 4:
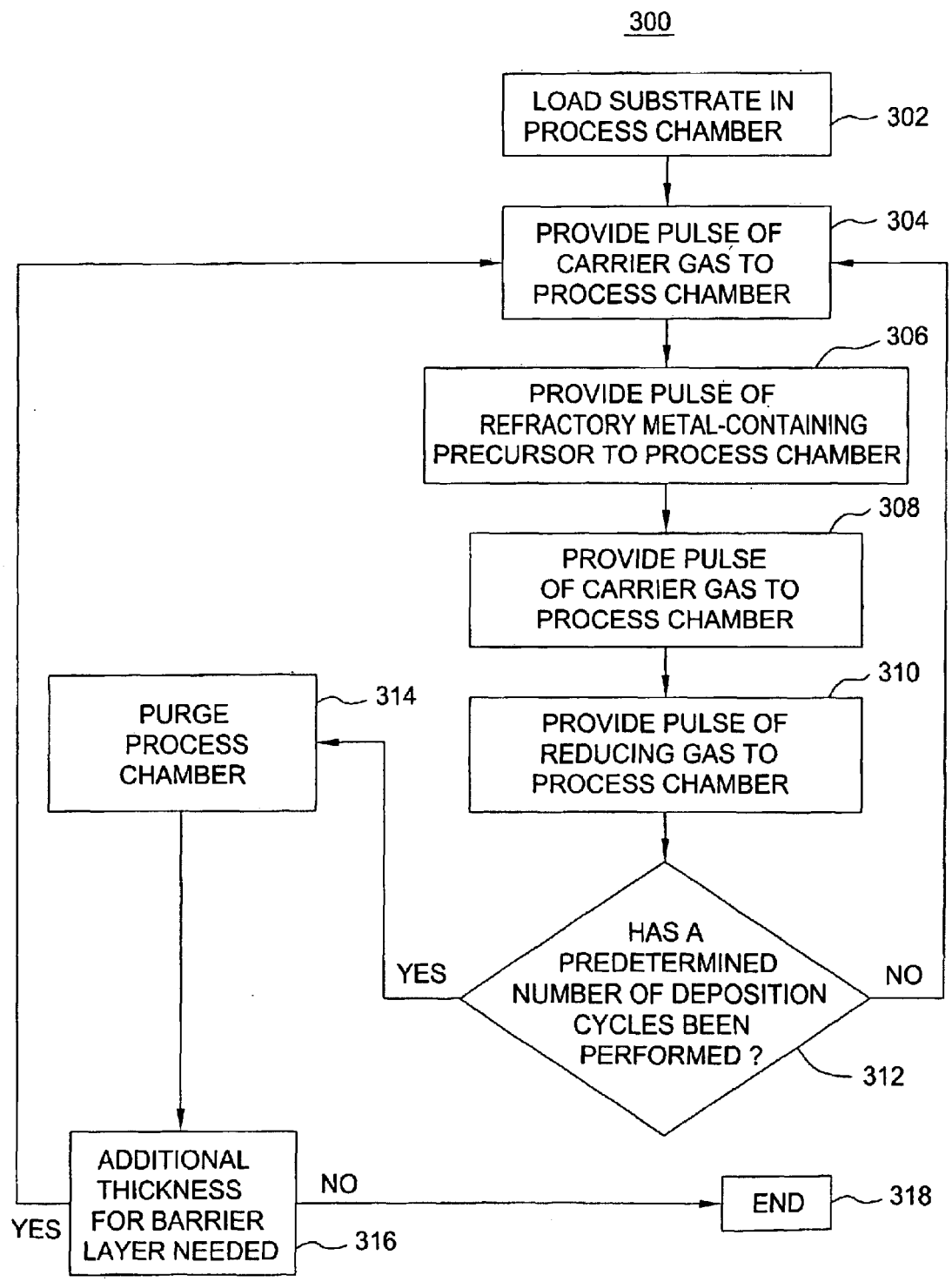
FIG. 4 illustrates a process sequence incorporating selective deposition of a barrier layer on a metal film using a cyclical deposition process according to an alternate embodiment described herein.

In an alternate process sequence described with respect to FIG. 4, the barrier layer deposition cycle may comprise separate pulses for each of the refractory metal-containing precursor, the reducing gas and the carrier gas. For such an embodiment, a barrier layer deposition sequence 300 includes introducing a substrate into the process chamber (step 302), providing a pulse of a carrier gas to the process chamber (step 304), providing a pulse of a refractory metal-containing precursor to the process chamber (step 306), providing a pulse of a carrier gas to the process chamber (step 308), providing a pulse of a reducing gas to the process chamber (step 310), and repeating steps 304 through 310 until a predetermined number of deposition cycles are performed (step 312). When a predetermined number of deposition cycles have been completed, the process chamber is purged of both the refractory metal-containing precursor and the reducing gas (step 314). After the process chamber is purged, additional predetermined numbers of deposition cycles (steps 304 through 310) may be performed until a desired thickness for the barrier layer is achieved (step 316), or ended (step 318).

The time intervals for each of the pulses of the refractory metal-containing precursor, the reducing gas and the carrier gas may have the same or different durations as discussed above with respect to FIG. 3. Alternatively, corresponding time intervals for one or more pulses of the refractory metal-containing precursor, the reducing gas and the carrier gas in one or more of the deposition cycles of the barrier layer deposition process may have different durations.

In FIGS. 3–4, the barrier layer deposition cycle is depicted as beginning with a pulse of the refractory metal-containing precursor followed by a pulse of the reducing gas. Alternatively, the barrier layer deposition cycle may start with a pulse of the reducing gas followed by a pulse of the refractory metal-containing precursor. In addition, a pulse may comprise one injection of a gas or several short, sequential injections.

One exemplary deposition cycle for selectively forming a tungsten barrier layer on copper features that are surrounded by organosilicate insulating material comprises sequentially providing pulses of silane ($SiH_4$) and pulses of tungsten hexafluoride ($WF_6$) to a process chamber similar to that described above with reference to FIG. 2. For such a deposition cycle, argon (Ar) may be provided to an appropriate flow control valve, for example an electronic flow control valve, at a flow rate of between about 100 sccm (standard cubic centimeters per second) to about 1000 sccm, preferably at about 300 sccm, and thereafter pulsed for about 100 msec (milliseconds) to about 1000 msec, preferably for about 500 msec. The silane ($SiH_4$) may be provided to an appropriate flow control valve, for example an electronic flow control valve, at a flow rate of between about 10 sccm to about 200 sccm, preferably at about 20 sccm, and thereafter pulsed for about 100 msec to about 1000 msec, preferably for about 500 msec. A carrier gas comprising hydrogen ($H_2$) may be provided along with the silane ($SiH_4$) at a flow rate of between about 100 sccm to about 1000 sccm, preferably at about 300 sccm. Argon is than provided at a flow rate of between about 100 sccm (standard cubic centimeters per second) to about 1000 sccm, preferably at about 300 sccm, and thereafter pulsed for about 100 msec (milliseconds) to about 1000 msec, preferably for about 500 msec. The tungsten hexafluoride ($WF_6$) may be provided to an appropriate flow control valve, for example an electronic flow control valve, at a flow rate of between about 10 sccm to about 100 sccm, preferably at about 30 sccm, and thereafter pulsed for about 100 msec to about 1000 msec, preferably for about 500 msec. A carrier gas comprising argon (Ar) may be provided along with the tungsten hexafluoride ($WF_6$) at a flow rate of between about 100 sccm to about 1000 sccm, preferably at about 300 sccm. The substrate may be maintained at a temperature between about 250° C. to about 375° C., preferably at about 300° C., at a chamber pressure of about 1 torr to about 40 torr, preferably at about 5 torr.

After a predetermined number of deposition cycles are performed, the process chamber is purged by providing a flow of the carrier gas thereto. Gases such as for example, argon (Ar), helium (He), nitrogen ($N_2$) and hydrogen ($H_2$), among others may be used. The process chamber may be purged by providing a flow of gas at about 300 sccm to about 1000 sccm, preferably at about 600 sccm, for a duration of up to about 2 seconds, preferably for about 0.3 seconds.

Figure 5A:
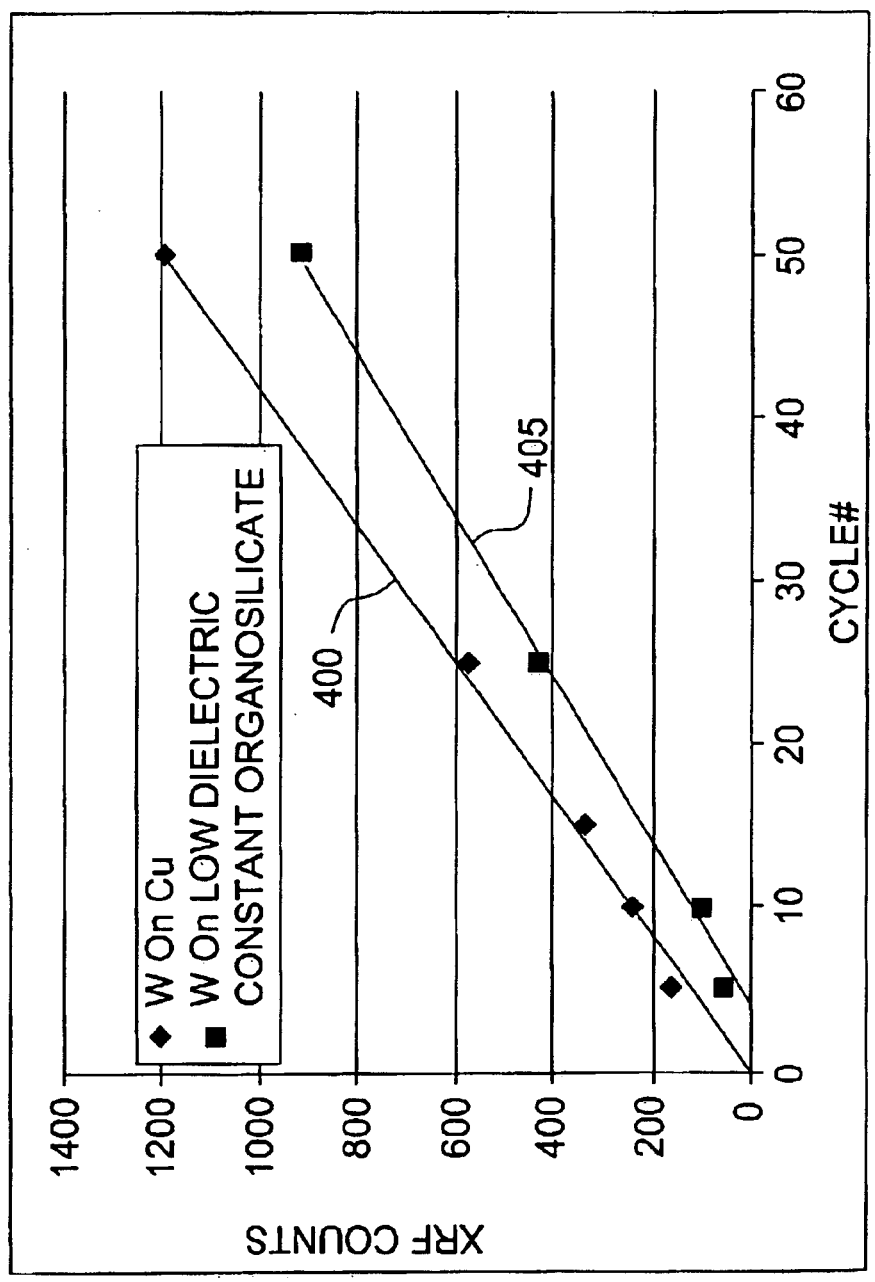
FIG. 5A is a graph showing the number of deposition cycles needed to start forming a tungsten layer on copper as compared to the number of deposition cycles needed to start forming a tungsten layer on a low dielectric constant organosilicate material.

FIG. 5A is a plot illustrating the number of deposition cycles needed to start forming a tungsten layer on copper as compared to the number of deposition cycles needed to start forming a tungsten layer on a low dielectric constant organosilicate material (dielectric constant less than about 3.5). Each deposition cycle was performed at a substrate temperature of about 300° C., a deposition chamber pressure of about 5 torr, a silane ($SiH_4$) flow of about 20 sccm with a hydrogen ($H_2$) carrier flow of 300 sccm that is pulsed for about 500 msec, a tungsten hexafluoride (WF$_6$) flow of about 30 sccm with an argon (Ar) flow of about 300 sccm that is pulsed for about 500 msec, and an argon (Ar) flow of about 300 sccm for about 500 msec between each pulse of the silane (SiH$_4$) and each pulse of the tungsten hexafluoride (WF$_6$).

Referring to FIG. 5A, tungsten starts to deposit on the copper during a first deposition cycle, as indicated by line 400. However, the tungsten starts to deposit on the low dielectric constant organosilicate material during the fourth deposition cycle, as indicated by line 405. As such, for the process conditions recited above with respect to FIG. 5A, selective deposition of tungsten on copper without deposition on the organosilicate material, necessitates that the process chamber be purged each time three deposition cycles have been completed.

Figure 5B:
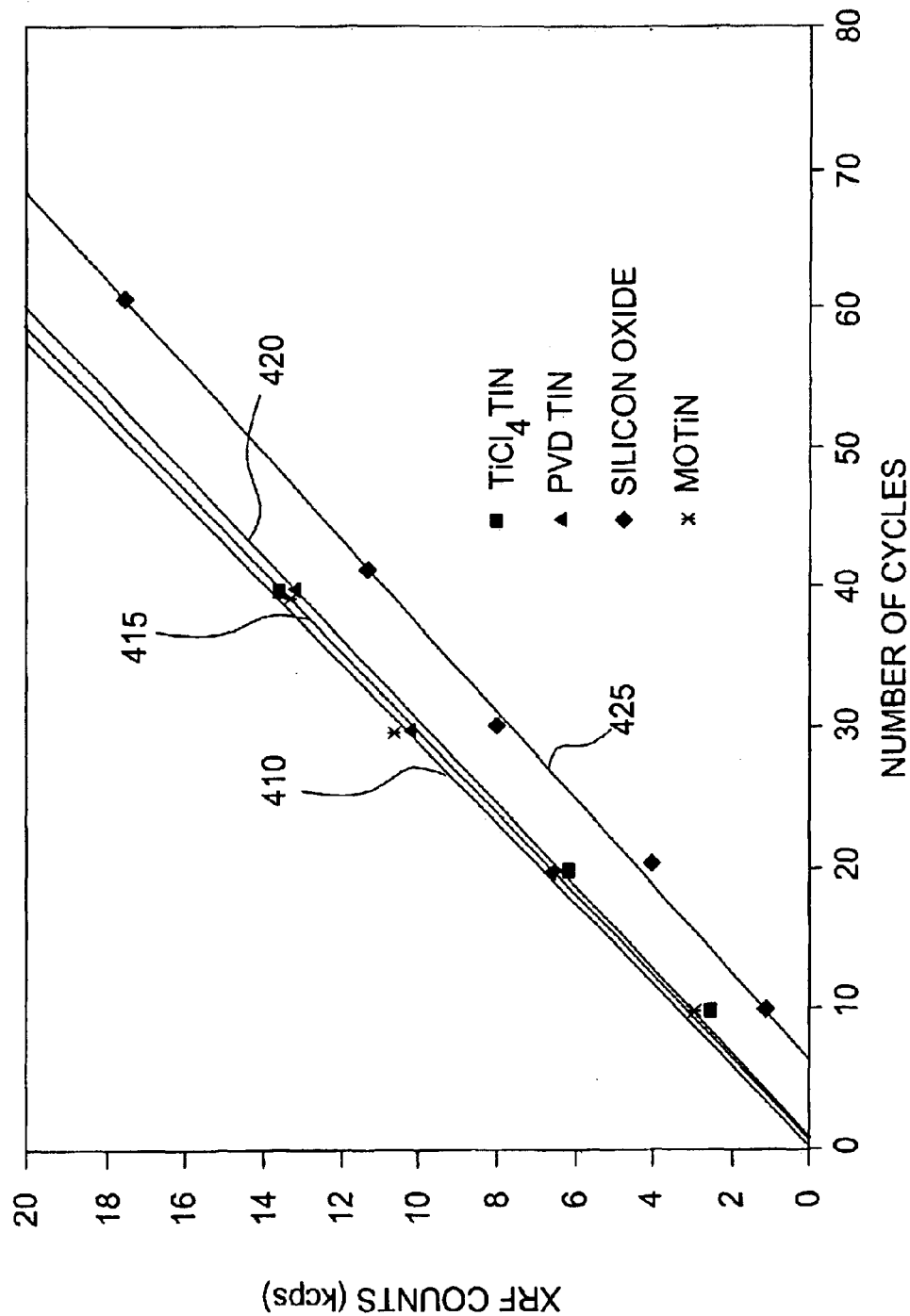
FIG. 5B is a graph showing the number of deposition cycles needed to start forming a tungsten layer on titanium nitride layers as compared to the number of deposition cycles needed to start forming a tungsten layer on silicon oxide.

FIG. 5B is a plot illustrating the number of deposition cycles needed to start forming a tungsten layer on a titanium nitride layer deposited using a physical vapor deposition (PVD) process, a titanium nitride layer deposited from a metallorganic precursor in a chemical vapor deposition (MOCVD) process, or a titanium nitride layer deposited from a titanium tetrachloride (TiCl$_4$) precursor in a chemical vapor deposition (CVD) process as compared to the number of deposition cycles needed to start forming a tungsten layer on silicon oxide material. Each deposition cycle was performed at a substrate temperature of about 300° C., a deposition chamber pressure of about 5 torr, a silane (SiH$_4$) flow of about 20 sccm with a hydrogen (H$_2$) carrier flow of 300 sccm that is pulsed for about 500 msec, a tungsten hexafluoride (WF$_6$) flow of about 30 sccm with an argon (Ar) flow of about 300 sccm that is pulsed for about 500 msec, and an argon (Ar) flow of about 300 sccm for about 500 msec between each pulse of the silane (SiH$_4$) and each pulse of the tungsten hexafluoride (WF$_6$).

Referring to FIG. 5B, tungsten starts to deposit on the titanium nitride layer deposited from a metallorganic precursor using a chemical vapor deposition (MOCVD) process during a first deposition cycle, as indicated by line 410. Tungsten starts to deposit on the titanium nitride layer deposited using a physical vapor deposition (PVD) process, or a titanium nitride layer deposited from a titanium tetrachloride (TiCl$_4$) precursor using a chemical vapor deposition (CVD) during a second deposition cycle, as indicated by lines 415, 420, respectively. However, the tungsten starts to deposit on the silicon oxide during the seventh deposition cycle, as indicated by line 425. As such, for the process conditions recited above with respect to FIG. 5B, selective deposition of tungsten on either of the titanium nitride layers without deposition on the silicon oxide necessitates that the process chamber be purged each time six deposition cycles have been completed.

Figure 5C:
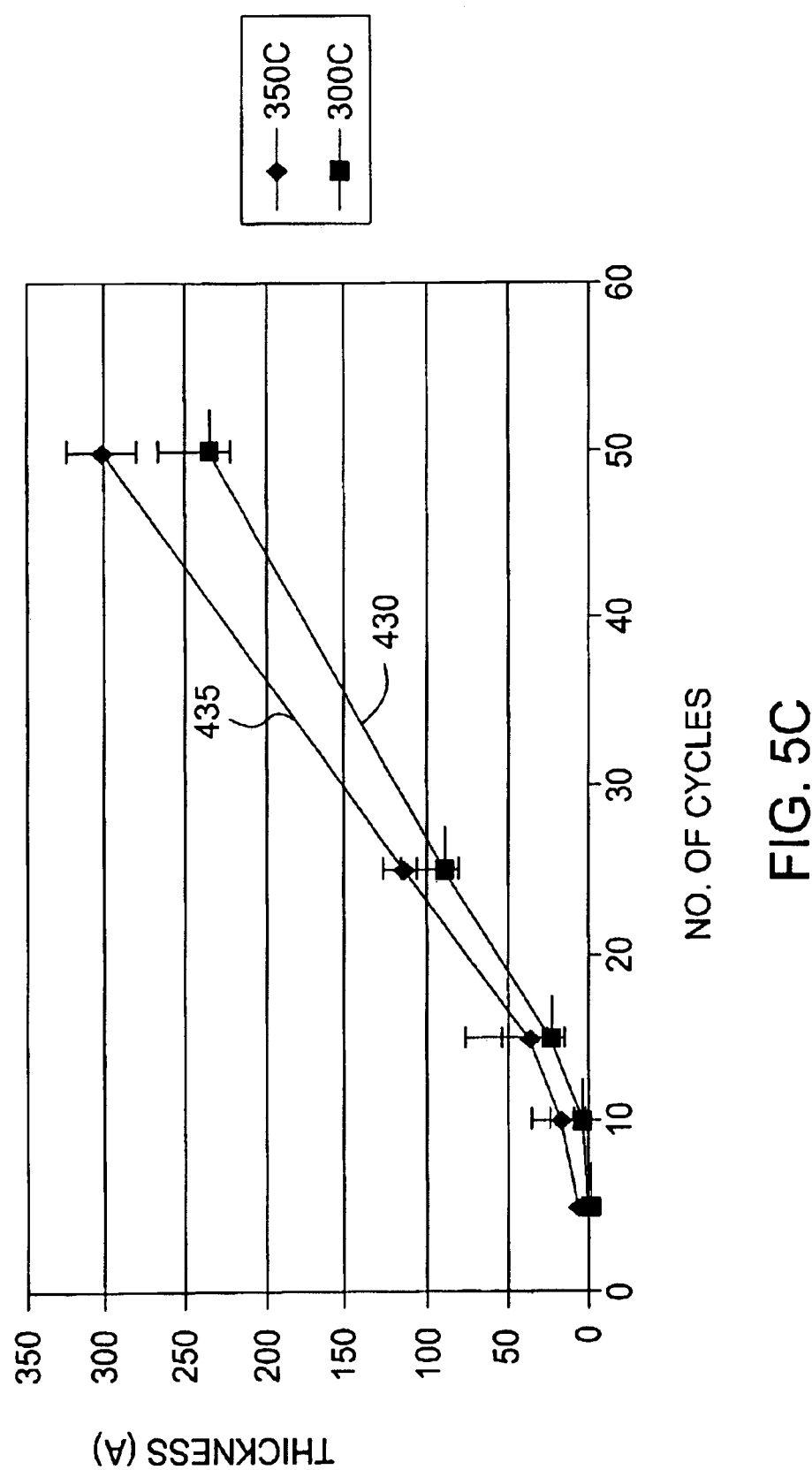
FIG. 5C is a graph showing the number of deposition cycles needed to start forming a tungsten layer on silicon carbide at a temperature of 300° C. and at a temperature of 350° C.

The number of deposition cycles needed to start forming a tungsten layer on an dielectric insulating material may vary as a function of the substrate temperature. For example, a tungsten layer was formed on silicon carbide at a substrate temperature of about 300° C. and a substrate temperature of about 350° C. Each deposition cycle was performed at a deposition chamber pressure of about 5 torr, a silane (SiH$_4$) flow of about 20 sccm with a hydrogen (H$_2$) carrier flow of 300 sccm that is pulsed for about 500 msec, a tungsten hexafluoride (WF$_6$) flow of about 30 sccm with an argon (Ar) flow of about 300 sccm that is pulsed for about 500 msec, and an argon (Ar) flow of about 300 sccm for about 500 msec between each pulse of the silane (SiH$_4$) and each pulse of the tungsten hexafluoride (WF$_6$). Referring to FIG. 5C, ten deposition cycles were needed to start forming a tungsten layer on silicon carbide at a substrate temperature of about 300° C., as indicated by line 430. In contrast, only five deposition cycles were needed to start forming a tungsten layer on silicon carbide when the substrate temperature was raised to about 350° C., as indicated by line 435.

Integrated Circuit Fabrication Process

Figure 6A:
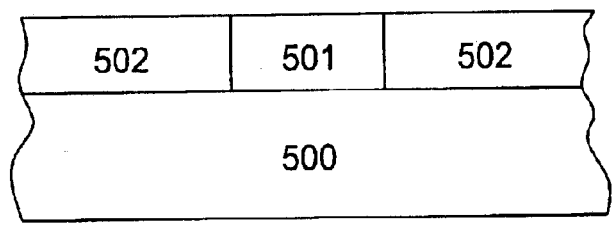
FIGS. 6A–6D depict cross-sectional views of a substrate at different stages of an interconnect fabrication process.

FIGS. 6A–6D illustrate schematic cross-sectional views of a substrate 500 at different stages of an integrated circuit fabrication sequence incorporating a tungsten barrier layer formed on conductive leads. Depending on the specific stage of processing, substrate 500 may correspond to a silicon substrate, or other material layer that has been formed on the substrate 500. FIG. 6A, for example, illustrates a cross-sectional view of a substrate 500 having conductive leads formed thereon surrounded by a dielectric material. The conductive leads 501 may be a metal (e.g., aluminum (Al) or copper (Cu)). The dielectric material 502 may be an oxide (silicon oxide) as well as low dielectric constant materials such as BLACK DIAMOND™, or other insulating materials with dielectric constants less than 3.5.

FIG. 6A illustrates one embodiment in which the substrate 500 is silicon having copper leads 501 formed thereon. The copper leads 501 have a thickness of about 5,000 Å to about 5 microns depending on the size of the structure to be fabricated. A dielectric material 502 surrounds the copper leads 501. The dielectric material 502 may be a low dielectric constant silicon oxide layer. The dielectric material 502 has a thickness corresponding to the thickness of the copper leads 501.

Figure 6B:
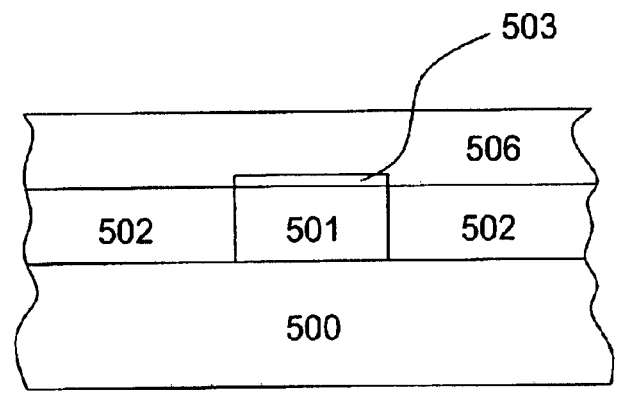

Referring to FIG. 6B, a tungsten barrier layer 503 is selectively formed on the copper leads 501. The tungsten barrier layer 503 may be formed according to the process parameters described above with respect to FIGS. 3–4. The thickness of the tungsten barrier layer 503 should be about 30 Å to about 50 Å. Formation of the tungsten barrier layer 503 on the copper leads 501 advantageously eliminates the need for the deposition of a, dielectric barrier material such as for example, silicon carbide, thereover. Eliminating the need for a silicon carbide dielectric layer on the copper leads 501 in effect keeps the overall dielectric constant of the interconnect structure lower than it otherwise would be, since silicon carbide has a dielectric constant of about 4.0 to about 5.0 and the presence of such a layer would increase the overall dielectric constant of the interconnect structure.

A bulk-insulating layer 506 is formed on the tungsten barrier layer 503 and the dielectric material 502. The bulk-insulating layer 506 may be a silicon oxide formed as is well known in the art. The bulk-insulating layer should have a thickness of about 5,000 Å to about 10,000 Å.

Figure 6C:
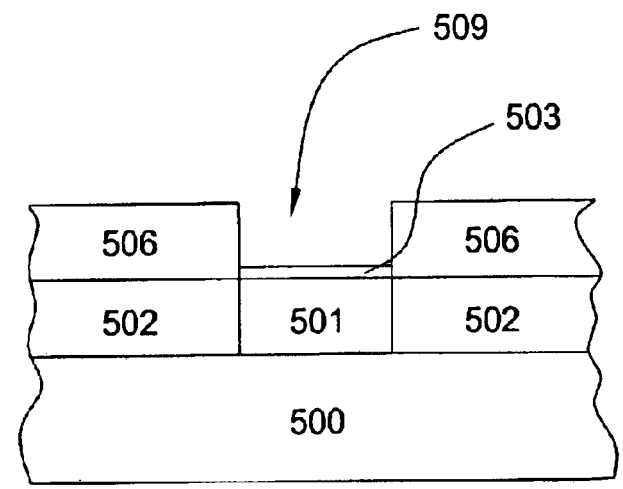

Referring to FIG. 6C, vias 509 are defined in the bulk-insulating layer 506 over the copper leads 501. The vias 509 are defined in the bulk-insulating layer 506 using conventional lithography and etching techniques.

Figure 6D:
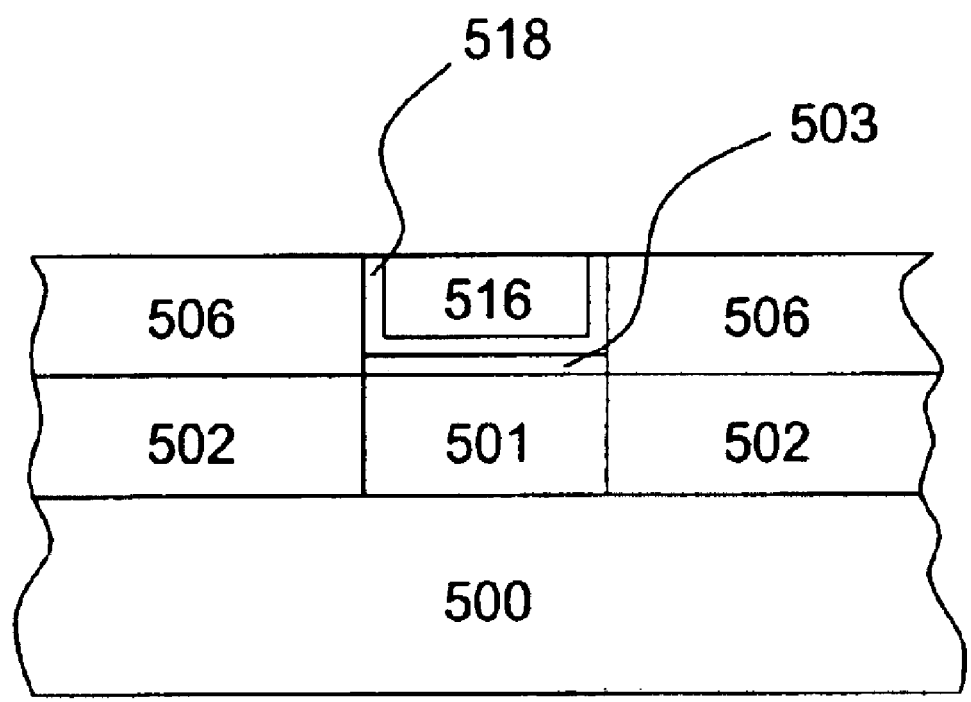

Thereafter, referring to FIG. 6D, the vias 509 are filled with a conductive material 516 such as aluminum (Al), copper (Cu), tungsten (W), or combinations thereof. Preferably, copper (Cu) is used to fill the vias 509 due to its low resistivity (resistivity of about 1.7 $\mu\Omega$/cm). The conductive material 516 may be deposited using chemical vapor deposition (CVD) techniques, physical vapor deposition (PVD) techniques, electroplating techniques, or combinations thereof.

Additionally, a barrier layer 518 such as tantalum (Ta), tantalum nitride (TaN), titanium (Ti), titanium nitride (TiN), or other suitable barrier material may be deposited conformably on vias 509, before filling them with the conductive material 516. The barrier layer 518 functions to prevent metal migration into the bulk-insulating layer 506.

While foregoing is directed to the preferred embodiment of the present invention, other and further embodiments of the invention may be devised without departing from the basic scope thereof, and the scope thereof is determined by the claims that follow.

What is claimed is:

1. A method of selectively forming a barrier layer on a metal feature, comprising:
   providing a substrate having exposed metal features surrounded by a dielectric material to a process environment;
   forming the barrier layer on the exposed metal features using a cyclical deposition process wherein the cyclical deposition process includes a predetermined number of deposition cycles followed by a purge, wherein the predetermined number of deposition cycles is selected to start forming the barrier layer on the exposed metal features but be less than the number of deposition cycles needed to start forming the barrier layer on the dielectric material, and wherein each deposition cycle comprises alternately providing a refractory metal-containing precursor and a reducing gas to the process environment; and
   repeating the cyclical deposition process until a desired thickness for the barrier layer is formed.

2. The method of claim 1, wherein the refractory metal-containing precursor is a tungsten-containing precursor.

3. The method of claim 2, wherein the tungsten-containing precursor is selected from the group consisting of tungsten hexafluoride and tungsten hexacarbonyl.

4. The method of claim 3, wherein the tungsten-containing precursor is tungsten hexafluoride.

5. The method of claim 2, wherein the tungsten-containing precursor is provided at a flow rate from about 10 sccm to about 100 sccm.

6. The method of claim 5, wherein the flow rate is about 30 sccm.

7. The method of claim 5, wherein the tungsten-containing precursor is provided for a duration from about 100 milliseconds to about 1,000 milliseconds.

8. The method of claim 7, wherein the duration is about 500 milliseconds.

9. The method of claim 1, wherein the reducing gas is selected from the group consisting of silane, disilane, dichlorosilane, borane, diborane, triborane, tetraborane, pentaborane, hexaborane, heptaborane, octaborane, nanoborane and decaborane.

10. The method of claim 9, wherein the reducing gas is silane or diborane.

11. The method of claim 1, wherein the reducing gas is provided at a flow rate from about 10 sccm to about 200 sccm.

12. The method of claim 11, wherein the flow rate is about 20 sccm.

13. The method of claim 1, wherein the reducing gas is provided for a duration from about 100 milliseconds to about 1,000 milliseconds.

14. The method of claim 13, wherein the duration is about 500 milliseconds.

15. The method of claim 1, wherein the purge comprises providing a purge gas to the process environment.

16. The method of claim 15, wherein the purge gas is selected from the group consisting of helium, argon, nitrogen, hydrogen, and combinations thereof.

17. The method of claim 15, wherein the purge gas is provided at a flow rate from about 300 sccm to about 1,000 sccm.

18. The method of claim 1, wherein the process environment comprises a temperature in a range from about 250° C. to about 375° C.

19. The method of claim 18, wherein the temperature is about 300° C.

20. The method of claim 1, wherein the process environment comprises a pressure in a range from about 1 Torr to about 40 Torr.

21. The method of claim 20, wherein the pressure is about 5 Torr.

22. A method of selectively forming a tungsten barrier layer on a metal feature, comprising:
   providing a substrate having exposed metal features surrounded by a dielectric material to a process environment;
   forming the tungsten barrier layer on the exposed metal features using a cyclical deposition process wherein the cyclical deposition process includes a predetermined number of deposition cycles followed by a purge, wherein the predetermined number of deposition cycles is selected to start forming the tungsten barrier layer on the exposed metal features but be less than the number of deposition cycles needed to start forming the tungsten barrier layer on the dielectric material, and wherein each desposition cycle comprises alternately providing a tungsten-containing precursor and a reducing gas to the process environment; and
   repeating the cyclical deposition process until a desired thickness for the tungsten barrier layer is formed.

23. The method of claim 22, wherein the tungsten-containing precursor is selected from the group consisting of tungsten hexafluoride and tungsten hexacarbonyl.

24. The method of claim 23, wherein the tungsten-containing precursor is tungsten hexafluoride.

25. The method of claim 22, wherein the tungsten-containing precursor is provided at a flow rate from about 10 sccm to about 100 sccm.

26. The method of claim 25, wherein the flow rate is about 30 sccm.

27. The method of claim 22, wherein the tungsten-containing precursor is provided for a duration from about 100 milliseconds to about 1,000 milliseconds.

28. The method of claim 27, wherein the duration is about 500 milliseconds.

29. The method of claim 22, wherein the reducing gas is selected from the group consisting of silane, disilane, dichlorosilane, borane, diborane, triborane, tetraborane, pentaborane, hexaborane, heptaborane, octaborane, nanoborane and decaborane.

30. The method of claim 29, wherein the reducing gas is silane or diborane.

31. The method of claim 22, wherein the reducing gas is provided at a flow rate from about 10 sccm to about 200 sccm.

32. The method of claim 31, wherein the flow rate is about 20 sccm.

33. The method of claim 22, wherein the reducing gas is provided for a duration from about 100 milliseconds to about 1,000 milliseconds.

34. The method of claim 33, wherein the duration is about 500 milliseconds.

35. The method of claim 22 wherein the purge comprises providing a purge gas to the process environment.

36. The method of claim 35, wherein the purge gas is selected from the group consisting of helium, argon, nitrogen, hydrogen, and combinations thereof.

37. The method of claim 35, wherein the purge gas is provided at a flow rate from about 300 sccm to about 1,000 sccm.

38. The method of claim 22, wherein the process environment comprises a temperature in a range from about 250° C. to about 375° C.

39. The method of claim 38, wherein the temperature is about 300° C.

40. The method of claim 22, wherein the process environment comprises a pressure in a range from about 1 Torr to about 40 Torr.

41. The method of claim 40, wherein the pressure is about 5 Torr.

42. A method of selectively forming a barrier layer on a metal feature, comprising:

providing a substrate having exposed metal features surrounded by a dielectric material to a process environment;

exposing the substrate including the dielectric material to a cyclical deposition process comprising a metal-containing precursor and a reducing gas;

forming the barrier layer on the exposed metal features while not forming the barrier layer on the dielectric material; and repeating the cyclical deposition process until a desired thickness for the barrier layer is formed on the metal feature.

43. The method of claim 42, wherein the barrier layer comprises tungsten.

* * * * *

UNITED STATES PATENT AND TRADEMARK OFFICE
CERTIFICATE OF CORRECTION

PATENT NO. : 6,809,026 B2
DATED : October 26, 2004
INVENTOR(S) : Yoon et al.

It is certified that error appears in the above-identified patent and that said Letters Patent is hereby corrected as shown below:

Column 11,
Line 38, delete "claim 5" and insert -- claim 2 --, therefor.

Signed and Sealed this

Twelfth Day of July, 2005

JON W. DUDAS
*Director of the United States Patent and Trademark Office*